(12) United States Patent
Hori et al.

(10) Patent No.: US 9,142,687 B2
(45) Date of Patent: Sep. 22, 2015

(54) SEMICONDUCTOR DIODE DEVICE

(71) Applicant: Kabushiki Kaisha Toshiba, Minato-ku, Tokyo (JP)

(72) Inventors: Yoichi Hori, Hyogo-ken (JP); Takao Noda, Hyogo-ken (JP); Kohei Morizuka, Hyogo-ken (JP); Ryoichi Ohara, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/201,711

(22) Filed: Mar. 7, 2014

(65) Prior Publication Data

US 2015/0001552 A1 Jan. 1, 2015

(30) Foreign Application Priority Data

Jul. 1, 2013 (JP) ................................. 2013-138244

(51) Int. Cl.
*H01L 29/872* (2006.01)
*H01L 29/16* (2006.01)
*H01L 29/66* (2006.01)
*H01L 29/06* (2006.01)

(52) U.S. Cl.
CPC .......... *H01L 29/872* (2013.01); *H01L 29/0603* (2013.01); *H01L 29/0615* (2013.01); *H01L 29/0692* (2013.01); *H01L 29/1608* (2013.01); *H01L 29/6606* (2013.01); *H01L 29/0619* (2013.01); *H01L 29/66037* (2013.01)

(58) Field of Classification Search
USPC ........................................... 257/77, 471–486
See application file for complete search history.

(56) References Cited

U.S. PATENT DOCUMENTS

| 6,867,476 B2 * | 3/2005 | Lee ................................ 257/549 |
| 6,979,863 B2 * | 12/2005 | Ryu ............................... 257/335 |
| 7,728,402 B2 | 6/2010 | Zhang et al. |
| 8,232,558 B2 | 7/2012 | Zhang et al. |
| 8,432,012 B2 | 4/2013 | Zhang et al. |
| 2012/0212164 A1 | 8/2012 | Terakawa et al. |
| 2012/0228636 A1 | 9/2012 | Maeyama et al. |
| 2012/0241762 A1 | 9/2012 | Noda et al. |
| 2015/0035111 A1 | 2/2015 | Ota et al. |

FOREIGN PATENT DOCUMENTS

| JP | 07-226521 A | 8/1995 |
| JP | 2006-086417 A | 3/2006 |
| JP | 2010-225878 A | 10/2010 |
| JP | 2012-231019 A | 11/2012 |

* cited by examiner

*Primary Examiner* — Matthew Reames
*Assistant Examiner* — Vincent Wall
(74) *Attorney, Agent, or Firm* — White & Case LLP

(57) ABSTRACT

According to one embodiment, a semiconductor device includes a first semiconductor region, a first electrode, a second semiconductor region, a third semiconductor region, a fourth semiconductor region, a fifth semiconductor region, and a second electrode. The first electrode forms a Schottky junction with the first region. The second region is provided between the first region and the first electrode. The third region is provided between the first region and the first electrode and forms an ohmic junction with the first electrode. The fourth region is provided between the first region and the third region. The fourth region has a higher impurity concentration than the first region. The fifth region is provided between the third region and the first electrode. The fifth region has a higher impurity concentration than the third region. The second electrode is provided on opposite side of the first region from the first electrode.

18 Claims, 8 Drawing Sheets

SEMICONDUCTOR DIODE DEVICE

CROSS-REFERENCE TO RELATED APPLICATIONS

This application is based upon and claims the benefit of priority from Japanese Patent Application No. 2013-138244, filed on Jul. 1, 2013; the entire contents of which are incorporated herein by reference.

FIELD

Embodiments described herein relate generally to a semiconductor device.

BACKGROUND

As a device having rectification functionality, a JBS (junction barrier Schottky) diode including both a Schottky barrier junction and a p-n junction is known. The JBS diode includes a plurality of p-type semiconductor regions formed in an n-type semiconductor region, and a Schottky barrier metal in contact with the n-type semiconductor region and the p-type semiconductor region. The JBS diode has a structure for reducing leakage by relaxing the electric field at the interface between the n-type semiconductor region and the Schottky electrode under reverse bias. In semiconductor devices, it is important to further improve the withstand capability for surge voltage and the like.

DETAILED DESCRIPTION

Figure 1:
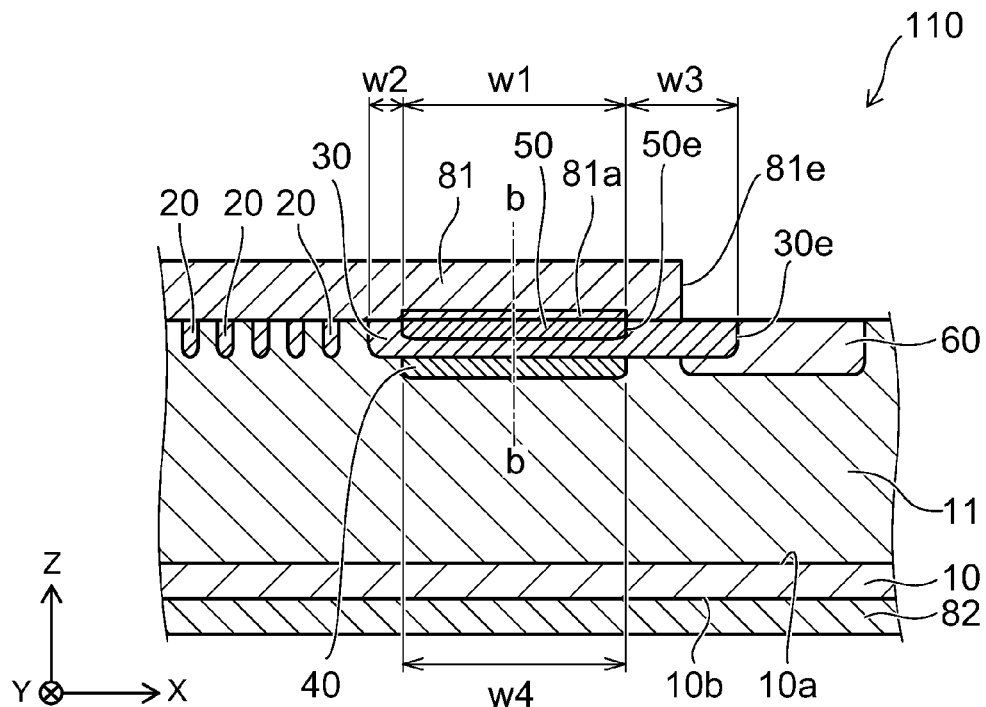
FIG. 1 is a schematic sectional view illustrating the configuration of a semiconductor device according to a first embodiment.

In general, according to one embodiment, a semiconductor device includes a first semiconductor region, a first electrode, a second semiconductor region, a third semiconductor region, a fourth semiconductor region, a fifth semiconductor region, and a second electrode. The first semiconductor region has a first conductivity type. The first electrode forms a Schottky junction with the first semiconductor region. The second semiconductor region of a second conductivity type is provided between the first semiconductor region and the first electrode. The third semiconductor region of the second conductivity type is provided between the first semiconductor region and the first electrode. The third semiconductor region forms an ohmic junction with the first electrode. The fourth semiconductor region of the first conductivity type is provided between the first semiconductor region and the third semiconductor region. The fourth semiconductor region has a higher impurity concentration than the first semiconductor region. The fifth semiconductor region of the second conductivity type is provided between the third semiconductor region and the first electrode. The fifth semiconductor region has a higher impurity concentration than the third semiconductor region. The second electrode is provided on opposite side of the first semiconductor region from the first electrode. Various embodiments will be described hereinafter with reference to the accompanying drawings.

In the following description, like members are labeled with like reference numerals, and the description of the members once described is omitted appropriately. In the following description, the notations of $n^+$, $n$, $n^-$ and $p^+$, $p$, $p^-$ represent relative magnitude of impurity concentration in each conductivity type. That is, the symbol with more plus signs represents relatively higher impurity concentration, and the symbol with more minus signs represents relatively lower impurity concentration. Furthermore, in the following description, by way of example, the first conductivity type is n-type, and the second conductivity type is p-type.

(First Embodiment)

FIG. 1 is a schematic sectional view illustrating the configuration of a semiconductor device according to a first embodiment.

Figure 2:
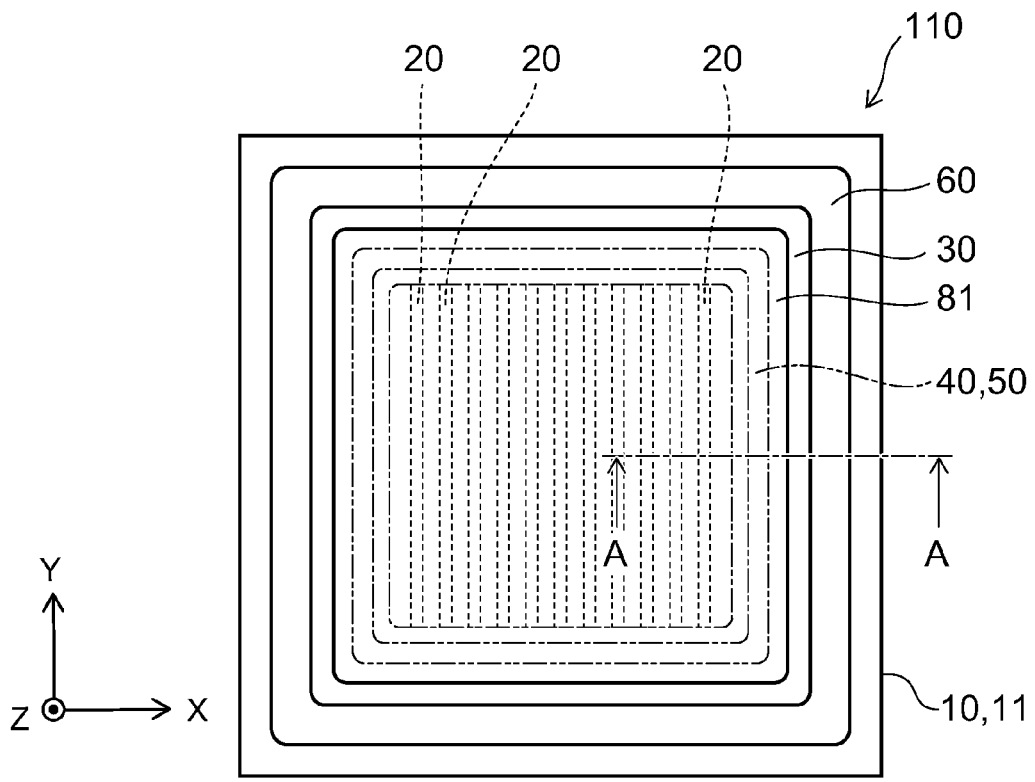
FIG. 2 is a schematic plan view illustrating the configuration of the semiconductor device according to the first embodiment.

FIG. 2 is a schematic plan view illustrating the configuration of the semiconductor device according to the first embodiment.

FIG. 1 shows a schematic sectional view taken along line A-A shown in FIG. 2.

As shown in FIG. 1, the semiconductor device 110 according to this embodiment includes an $n^-$-type semiconductor region (first semiconductor region) 11, an anode electrode (first electrode) 81, a first p-type semiconductor region (second semiconductor region) 20, a second p-type semiconductor region (third semiconductor region) 30, an $n^-$-type semiconductor region (fourth semiconductor region) 40, a $p^+$-type semiconductor region (fifth semiconductor region) 50, and a cathode electrode (second electrode) 82. The semiconductor device 110 includes a JBS diode and a P-N diode.

The $n^-$-type semiconductor region 11 is provided on e.g. an $n^+$-type substrate 10. The substrate 10 is e.g. a silicon carbide (SiC) substrate. For instance, the substrate 10 includes hexagonal SiC (e.g., 4H-SiC). The substrate 10 is e.g. a SiC bulk substrate fabricated by sublimation technique. The substrate 10 is doped with an n-type impurity (e.g., nitrogen (N)). The impurity concentration of the substrate 10 is e.g. approximately $1 \times 10^{18}$ cm$^{-3}$ or more and $5 \times 10^{18}$ cm$^{-3}$ or less.

The $n^-$-type semiconductor region 11 is a region formed by e.g. epitaxial growth on the first surface 10a of the substrate 10. The $n^-$-type semiconductor region 11 includes e.g. SiC. The $n^-$-type semiconductor region 11 contains an n-type impurity (e.g., N). The impurity concentration of the $n^-$-type semiconductor region 11 is e.g. approximately $5 \times 10^{14}$ cm$^{-3}$ or more and $5 \times 10^{16}$ cm$^{-3}$ or less. The impurity concentration of the $n^-$-type semiconductor region 11 is lower than the impurity concentration of the substrate 10. In this embodiment, the impurity concentration of the $n^-$-type semiconductor region 11 is approximately $1 \times 10^{15}$ cm$^{-3}$ or more and $2 \times 10^{16}$ cm$^{-3}$ or less.

The thickness of the $n^-$-type semiconductor region 11 is determined by the design of the breakdown voltage characteristics and other characteristics of the semiconductor device 110. For instance, in the case of a breakdown voltage of 600 volts (V), the thickness of the $n^-$-type semiconductor region 11 is 3.5 micrometers (μm) or more and approximately 7 μm or less.

The anode electrode 81 is caused to form a Schottky junction with the n⁻-type semiconductor region 11. The anode electrode 81 is provided on the opposite side of the n⁻-type semiconductor region 11 from the substrate 10. In this embodiment, the direction connecting the n⁻-type semiconductor region 11 and the anode electrode 81 is referred to as Z-direction. One of the directions orthogonal to the Z-direction is referred to as X-direction. The direction orthogonal to the Z-direction and the X-direction is referred to as Y-direction. Furthermore, the orientation from the n⁻-type semiconductor region 11 toward the anode electrode 81 along the Z-direction is referred to as upward (upper side), and the opposite is referred to as downward (lower side).

The anode electrode 81 is provided on the n⁻-type semiconductor region 11. The Schottky junction between the anode electrode 81 and the n⁻-type semiconductor region 11 constitutes a Schottky barrier diode (SBD). The anode electrode 81 is made of e.g. titanium (Ti).

The first p-type semiconductor region 20 is provided between the n⁻-type semiconductor region 11 and the anode electrode 81. The first p-type semiconductor region 20 is in contact with the anode electrode 81. The first p-type semiconductor region 20 includes e.g. SiC.

The first p-type semiconductor region 20 contains a p-type impurity (e.g., aluminum (Al) or boron (B)). The impurity concentration of the first p-type semiconductor region 20 is e.g. approximately $5 \times 10^{17}$ cm$^{-3}$ or more and $1 \times 10^{19}$ cm$^{-3}$ or less. In this embodiment, the impurity concentration of the first p-type semiconductor region 20 is approximately $1 \times 10^{18}$ cm$^{-3}$. The thickness (thickness in the Z-direction) of the first p-type semiconductor region 20 is e.g. approximately 0.3 μm or more and 1.2 μm or less. At the boundary between the first p-type semiconductor region 20 and the n⁻-type semiconductor region 11, a p-n junction is constituted.

As shown in FIG. 2, the first p-type semiconductor region 20 is provided e.g. so as to extend in one direction. In this embodiment, the first p-type semiconductor region 20 extends in the Y-direction. The first p-type semiconductor region 20 may be provided in a plurality. The plurality of first p-type semiconductor regions 20 may be provided in parallel at a prescribed spacing. Each of the plurality of first p-type semiconductor regions 20 may be provided in an island shape.

The second p-type semiconductor region 30 is provided between the n⁻-type semiconductor region 11 and the anode electrode 81. The second p-type semiconductor region 30 is caused to form an ohmic junction with the anode electrode 81. The second p-type semiconductor region 30 includes e.g. SiC.

The second p-type semiconductor region 30 contains a p-type impurity (e.g., Al or B). The impurity concentration of the second p-type semiconductor region 30 is e.g. approximately $5 \times 10^{17}$ cm$^{-3}$ or more and $1 \times 10^{19}$ cm$^{-3}$ or less. The impurity concentration of the second p-type semiconductor region 30 may be substantially equal to the impurity concentration of the first p-type semiconductor region 20. In this embodiment, "substantially equal" means the case of being equal and the case of including a manufacturing error.

The thickness (thickness in the Z-direction) of the second p-type semiconductor region 30 is e.g. approximately 0.3 μm or more and 1.2 μm or less. The thickness of the second p-type semiconductor region 30 may be substantially equal to the thickness of the first p-type semiconductor region 20.

The second p-type semiconductor region 30, the n⁻-type semiconductor region 11, and the substrate 10 constitute a P-N diode. As shown in FIG. 2, the second p-type semiconductor region 30 may be provided so as to surround the plurality of first p-type semiconductor regions 20 in the X-Y plane. Further, as will be described with reference to FIGS. 8A through 10, the second p-type semiconductor region 30 may be provided adjacent to the plurality of first p-type semiconductor regions 20 in the X-Y plane.

The n⁻-type semiconductor region 40 is provided between the n⁻-type semiconductor region 11 and the second p-type semiconductor region 30. The n⁻-type semiconductor region 40 is in contact with the second p-type semiconductor region 30. The n⁻-type semiconductor region 40 includes e.g. SiC.

The n⁻-type semiconductor region 40 contains an n-type impurity (e.g., N). The impurity concentration of the n⁻-type semiconductor region 40 is e.g. approximately $1 \times 10^{17}$ cm$^{-3}$ or more and $1 \times 10^{18}$ cm$^{-3}$ or less. The impurity concentration of the n⁻-type semiconductor region 40 is higher than the impurity concentration of the n⁻-type semiconductor region 11. In this embodiment, the impurity concentration of the n⁻-type semiconductor region 40 is approximately $2 \times 10^{17}$ cm$^{-3}$.

The p⁺-type semiconductor region 50 is provided between the second p-type semiconductor region 30 and the anode electrode 81. The p⁺-type semiconductor region 50 is in contact with the anode electrode 81. The p⁺-type semiconductor region 50 includes e.g. SiC.

The p⁺-type semiconductor region 50 contains a p-type impurity (e.g., Al or B). The impurity concentration of the p⁺-type semiconductor region 50 is e.g. approximately $2 \times 10^{19}$ cm$^{-3}$ or more and $5 \times 10^{20}$ cm$^{-3}$ or less. The impurity concentration of the p⁺-type semiconductor region 50 is higher than the impurity concentration of the second p-type semiconductor region 30. The p⁺-type semiconductor region 50 is provided to ensure the ohmic junction between the second p-type semiconductor region 30 and the anode electrode 81. In this embodiment, the impurity concentration of the p⁺-type semiconductor region 50 is approximately $1 \times 10^{20}$ cm$^{-3}$.

Preferably, the p⁺-type semiconductor region 50 is provided inside (in the interior of) the second p-type semiconductor region 30. That is, preferably, the p⁺-type semiconductor region 50 is surrounded with the second p-type semiconductor region 30, i.e., not in contact with the n⁻-type semiconductor region 11. This suppresses leakage current.

The width W1 in the X-direction of the p⁺-type semiconductor region 50 is e.g. approximately 20 μm or more and 100 μm or less. Preferably, the width W1 is e.g. four times or more the thickness of the n⁻-type semiconductor region 11. If the width W1 is narrow, the P-N diode is not easily turned to the on-state. Furthermore, the current concentration is made larger in the on-state and at the time of breakdown. If the width W1 is wide, the area of the JBS diode is made relatively small. In this embodiment, the width W1 is e.g. approximately 40 μm or more and 50 μm or less.

The width W2 in the X-direction from the inner end of the p⁺-type semiconductor region 50 to the inner end of the second p-type semiconductor region 30 is e.g. approximately 2 μm or more and 10 μm or less. The width W2 is e.g. approximately 1/20 or more and 1/5 or less of the width W1. In this embodiment, the width W2 is e.g. approximately 5 μm. The width W3 in the X-direction from the outer end of the p⁺-type semiconductor region 50 to the outer end of the second p-type semiconductor region 30 is e.g. approximately 5 μm or more and 20 μm or less. The width W3 is e.g. approximately 1/10 or more and 1/2 or less of the width W1. In this embodiment, the width W3 is e.g. approximately 20 μm.

Between the $p^+$-type semiconductor region 50 and the anode electrode 81, an ohmic electrode 81a for ensuring ohmic junction may be provided. The ohmic electrode 81a is made of e.g. nickel (Ni).

The cathode electrode 82 is provided on the opposite side of the $n^-$-type semiconductor region 11 from the anode electrode 81. In this embodiment, the cathode electrode 82 is in contact with the second surface 10b of the substrate 10. The second surface 10b is a surface on the opposite side of the substrate 10 from the first surface 10a. The cathode electrode 82 is caused to form an ohmic junction with the substrate 10. The cathode electrode 82 is made of e.g. Ni.

The semiconductor device 110 may further include a $p^-$-type semiconductor region (sixth semiconductor region) 60. The $p^-$-type semiconductor region 60 is provided so as to surround the end 30e of the second p-type semiconductor region 30. The $p^-$-type semiconductor region 60 contains a p-type impurity (e.g., Al or B). The impurity concentration of the $p^-$-type semiconductor region 60 is e.g. approximately $1 \times 10^{17}$ cm$^{-3}$ or more and $1 \times 10^{18}$ cm$^{-3}$ or less. The impurity concentration of the $p^-$-type semiconductor region 60 is lower than the impurity concentration of the second p-type semiconductor region 30. The $p^-$-type semiconductor region 60 is a termination region of the semiconductor device 110. In this embodiment, the impurity concentration of the $p^-$-type semiconductor region 60 is approximately $5 \times 10^{17}$ cm$^{-3}$.

In the semiconductor device 110, as viewed in the Z-direction, the outer peripheral edge 81e of the anode electrode 81 is provided between the end 50e of the $p^+$-type semiconductor region 50 and the end 30e of the second p-type semiconductor region 30. That is, as viewed in the Z-direction, the second p-type semiconductor region 30 is provided from the inside to the outside of the anode electrode 81.

The semiconductor device 110 as described above includes a JBS diode composed of the anode electrode 81, the cathode electrode 82, the $n^-$-type semiconductor region 11, and the first p-type semiconductor region 20, and a P-N diode composed of the anode electrode 81, the cathode electrode 82, the $n^-$-type semiconductor region 11, and the second p-type semiconductor region 30. The P-N diode is parallel connected with the JBS diode.

Next, the operation of the semiconductor device 110 is described.

A (forward) voltage is applied so that the anode electrode 81 is positive relative to the cathode electrode 82 of the semiconductor device 110. Then, electrons having left the anode electrode 81 and crossed the Schottky barrier flow through the $n^-$-type semiconductor region 11 and the substrate 10 to the cathode electrode 82. Furthermore, over a prescribed voltage (e.g., 3 V), electrons and holes exceeding the built-in potential flow through the p-n junction surface existing at the interface between the second p-type semiconductor region 30 and the $n^-$-type semiconductor region 11.

On the other hand, a (reverse) voltage is applied so that the anode electrode 81 is negative relative to the cathode electrode 82. Then, electrons cannot easily cross the Schottky barrier between the anode electrode 81 and the $n^-$-type semiconductor region 11. This suppresses the flow of electrons. Furthermore, a depletion layer extends primarily on the $n^-$-type semiconductor region 11 side of the p-n junction surface. Thus, the current does not substantially flow in the semiconductor device 110. Furthermore, when the reverse voltage is applied, the first p-type semiconductor region 20 relaxes the electric field at the interface between the anode electrode 81 and the $n^-$-type semiconductor region 11. This improves the breakdown voltage.

The semiconductor device 110 achieves compatibility between low on-voltage based on the SBD and low on-resistance based on the P-N diode.

Here, a surge voltage may be applied to the semiconductor device 110 so that the anode electrode 81 is negative. Then, if the $n^-$-type semiconductor region 40 is not provided, the electric field is likely to concentrate at the end 30e of the second p-type semiconductor region 30. However, in the semiconductor device 110, the $n^-$-type semiconductor region 40 is provided below the second p-type semiconductor region 30. Thus, the breakdown voltage in the p-n junction portion (boundary portion between the second p-type semiconductor region 30 and the $n^-$-type semiconductor region 11) is lower than in the case where the $n^-$-type semiconductor region 40 is not provided. As a result, when a surge voltage is applied, breakdown occurs more easily at the position of the $n^-$-type semiconductor region 40. In the semiconductor device 110, concentration of breakdown in the termination region is suppressed. This prevents device destruction in the termination region.

Preferably, the breakdown voltage in the $n^-$-type semiconductor region 40 is made lower than the breakdown voltage in the termination region. Then, breakdown occurs in the portion of the $n^-$-type semiconductor region 40 earlier than in the termination region. As a result, in the semiconductor device 110, device destruction in the termination region due to breakdown is prevented.

Figure 3:
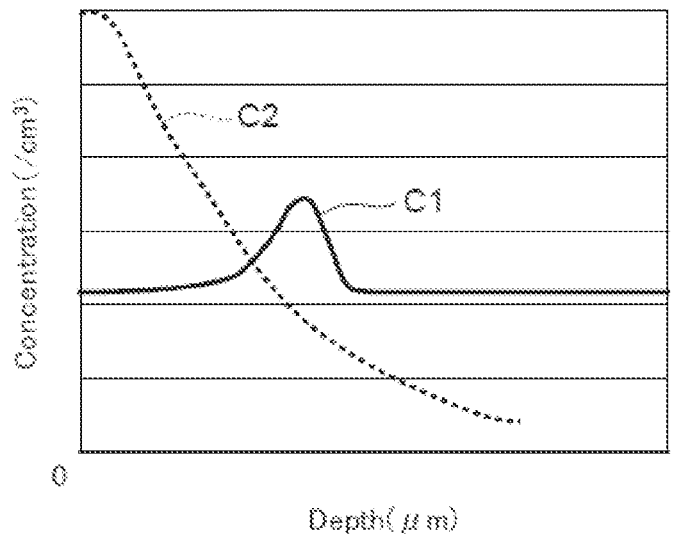
FIG. 3 illustrates an impurity concentration distribution.

FIG. 3 illustrates an impurity concentration distribution.

In FIG. 3, the horizontal axis represents depth, and the vertical axis represents the concentration of impurity. The horizontal axis represents the depth on line b-b shown in FIG. 1, where the boundary between the $p^+$-type semiconductor region 50 and the anode electrode 81 is set to "0". FIG. 3 shows the concentration distribution C1 of n-type impurity (N) and the concentration distribution C2 of p-type impurity (Al).

As shown in the concentration distribution C2 of p-type impurity, the concentration of p-type impurity gradually decreases in the depth direction from the boundary between the $p^+$-type semiconductor region 50 and the anode electrode 81. For convenience of description, in FIG. 1, the boundary between the $p^+$-type semiconductor region 50 and the second p-type semiconductor region 30 is clearly shown. However, the actual concentration of impurity gradually decreases as in the concentration distribution C2 of p-type impurity shown in FIG. 3.

As shown in the concentration distribution C1 of n-type impurity, the concentration of n-type impurity is high at the position of the $n^-$-type semiconductor region 40. The peak position of the concentration distribution C1 is located below the second p-type semiconductor region 30 (on the second p-type semiconductor region 30 side of the $n^-$-type semiconductor region 11).

Figure 4:
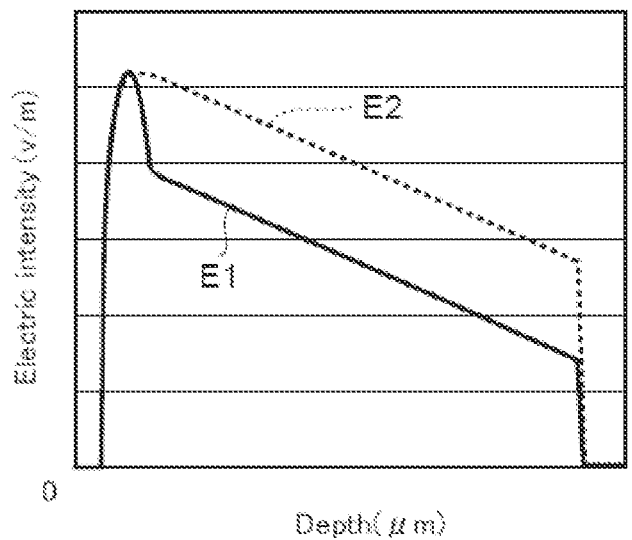
FIG. 4 illustrates an electric intensity distribution.

FIG. 4 illustrates an electric intensity distribution.

In FIG. 4, the horizontal axis represents depth, and the vertical axis represents electric intensity. The horizontal axis represents the depth on line b-b shown in FIG. 1, where the boundary between the $p^+$-type semiconductor region 50 and the anode electrode 81 is set to "0". FIG. 4 shows the electric intensity distribution E1 in the case of including the $n^-$-type semiconductor region 40, and the electric intensity distribution E2 in the case of not including the $n^-$-type semiconductor region 40.

As shown in the electric intensity distribution E2, the electric intensity in the case of not including the $n^-$-type semiconductor region 40 reaches its peak near the boundary between the second p-type semiconductor region 30 and the n⁻-type semiconductor region 11, and then gradually decreases in the depth direction.

As shown in the electric intensity distribution E1, the electric intensity in the case of including the n⁻-type semiconductor region 40 reaches its peak near the boundary between the second p-type semiconductor region 30 and the n⁻-type semiconductor region 11, and then sharply decreases at the position of the n⁻-type semiconductor region 40. Furthermore, the electric intensity of the electric intensity distribution E1 gradually decreases in the depth direction from the position of the n⁻-type semiconductor region 40.

That is, as seen from FIG. 4, in the electric intensity distribution E1 in the case of including the n⁻-type semiconductor region 40, the electric intensity is lower at the position of the n⁻-type semiconductor region 40 than in the electric intensity distribution E2 in the case of not including the n⁻-type semiconductor region 40.

Here, the integral of each of the electric intensity distributions E1 and E2 gives breakdown voltage. Thus, by including the n⁻-type semiconductor region 40, the breakdown voltage is made lower than in the case of not including the n⁻-type semiconductor region 40. In the semiconductor device 110, by providing the n⁻-type semiconductor region 40, breakdown is made more likely to occur. This suppresses breakdown concentrated in the termination region. As a result, device destruction in the termination region is prevented.

In the semiconductor device 110, the position of the n⁻-type semiconductor region 40 as viewed in the Z-direction is substantially equal to the position of the p⁺-type semiconductor region 50 as viewed in the Z-direction. For instance, the width W4 in the X-direction of the n⁻-type semiconductor region 40 is substantially equal to the width W1 in the X-direction of the p⁺-type semiconductor region 50. Furthermore, the position of the end of the n⁻-type semiconductor region 40 as viewed in the Z-direction is substantially equal to the position of the end of the p⁺-type semiconductor region 50 as viewed in the Z-direction. This enables the n⁻-type semiconductor region 40 to cause breakdown efficiently. Furthermore, in the area for reducing breakdown, the p⁺-type semiconductor region 50 can be maximally used, and the size of the anode electrode 81 is maximized. Thus, the forward current can be efficiently passed.

In the case where the position of the n⁻-type semiconductor region 40 as viewed in the Z-direction is made substantially equal to the position of the p⁺-type semiconductor region 50 as viewed in the Z-direction, the n⁻-type semiconductor region 40 and the p⁺-type semiconductor region 50 are formed by the same mask in the manufacturing method described below.

Next, a method for manufacturing the semiconductor device 110 is described.

FIGS. 5A to 6C are schematic sectional views illustrating the method for manufacturing the semiconductor device.

Figure 5A:
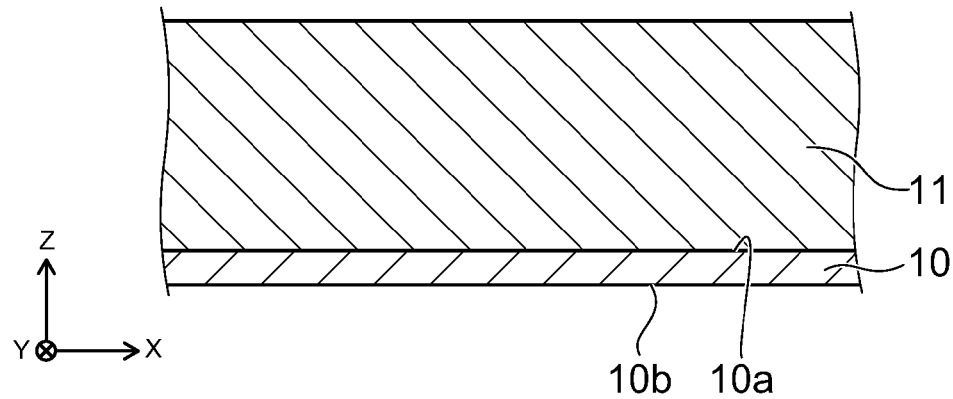
FIGS. 5A to 6C are schematic sectional views illustrating the method for manufacturing the semiconductor device.
Figure 5B:
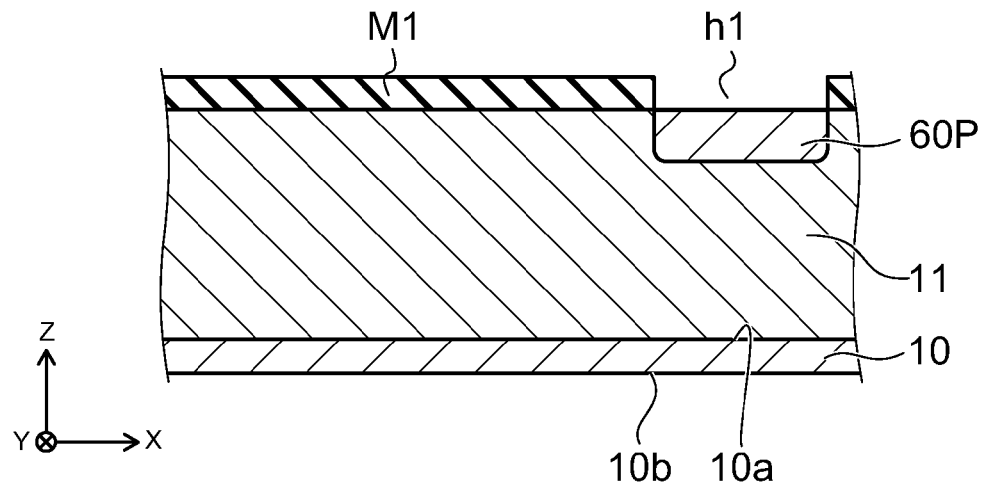

First, as shown in FIG. 5A, on the first surface 10a of a substrate 10, an n⁻-type semiconductor region 11 is formed. The substrate 10 is e.g. a SiC bulk substrate. The substrate 10 is doped with an n-type impurity (e.g., nitrogen (N)). The impurity concentration of the substrate 10 is e.g. approximately $1 \times 10^{18}$ cm⁻³ or more and $5 \times 10^{18}$ cm⁻³ or less.

The n⁻-type semiconductor region 11 is formed by epitaxial growth on the first surface 10a of the substrate 10. The n⁻-type semiconductor region 11 includes e.g. SiC. The n⁻-type semiconductor region 11 contains an n-type impurity (e.g., N). The impurity concentration of the n⁻-type semiconductor region 11 is e.g. approximately $5 \times 10^{14}$ cm⁻³ or more and $5 \times 10^{16}$ cm⁻³ or less. The impurity concentration of the n⁻-type semiconductor region 11 is lower than the impurity concentration of the substrate 10.

Figure 6A:
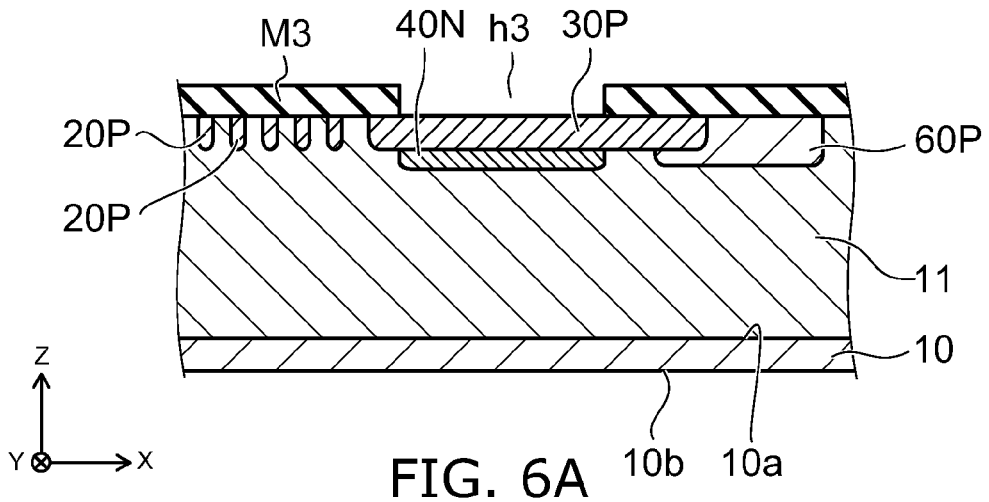

Next, as shown in FIG. 6A, on the n⁻-type semiconductor region 11, a mask M3 is formed, and an opening h3 is provided therein. The position of the opening h3 is located above the position for forming an n⁻⁻-type semiconductor region 40. Then, through the opening h3 of the mask M3, ions of n-type impurity such as N are implanted.

Thus, an ion implantation region 60P based on the p-type impurity is formed in the n⁻-type semiconductor region 11 below the opening h1. Then, the mask M1 is removed.

Figure 5C:
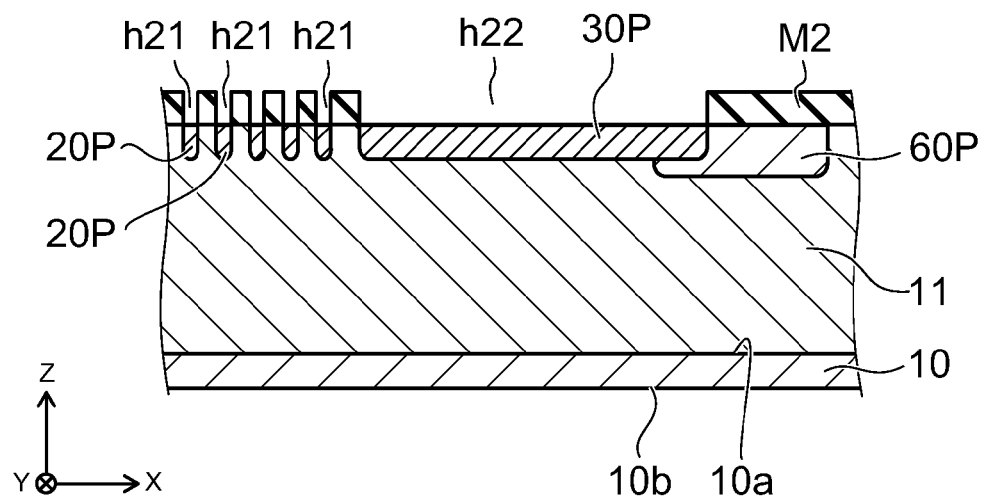

Next, as shown in FIG. 5C, on the n⁻-type semiconductor region 11, a mask M2 is formed, and openings h21 and h22 are provided therein. The position of the opening h21 is located above the position for forming a first p-type semiconductor region 20. The position of the opening h22 is located above the position for forming a second p-type semiconductor region 30. Then, through the openings h21 and h22 of the mask M2, ions of p-type impurity such as Al are implanted. Thus, an ion implantation region 20P based on the p-type impurity is formed in the n⁻-type semiconductor region 11 below the opening h21. Furthermore, an ion implantation region 30P based on the p-type impurity is formed in the n⁻-type semiconductor region 11 below the opening h22. Then, the mask M2 is removed.

Next, as shown in FIG. 6A, on the n⁻-type semiconductor region 11, a mask M3 is formed, and an opening h3 is provided therein. The position of the opening h3 is located above the position for forming an n⁻-type semiconductor region 40. Then, through the opening h3 of the mask M3, ions of n-type impurity such as N are implanted.

Thus, an ion implantation region 40N based on the n-type impurity is formed on the lower side of the ion implantation region 30P below the opening h3.

Figure 6B:
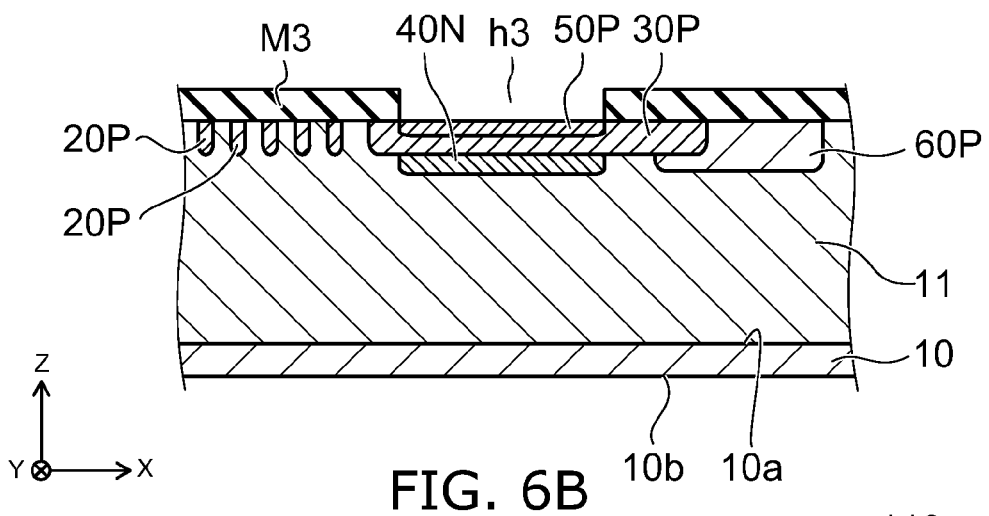

Next, as shown in FIG. 6B, by using the mask M3 used in the previous ion implantation, ions of p-type impurity such as Al are implanted. Thus, an ion implantation region 50P based on the p-type impurity is formed on the surface side of the ion implantation region 30P below the opening h3. Then, the mask M3 is removed.

Next, thermal diffusion is performed. Thus, ions of the ion implantation regions 20P, 30P, 40N, 50P, and 60P are activated. Accordingly, a first p-type semiconductor region 20, a second p-type semiconductor region 30, an n⁻-type semiconductor region 40, a p⁺-type semiconductor region 50, and a p⁻-type semiconductor region 60 are formed.

Figure 6C:
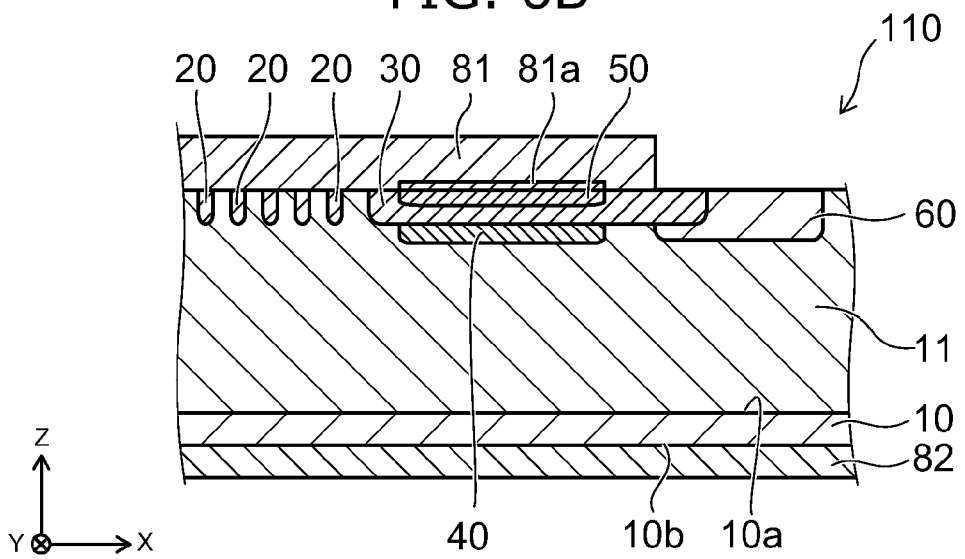

Next, as shown in FIG. 6C, an anode electrode 81 and a cathode electrode 82 are formed. The anode electrode 81 is formed on the n⁻-type semiconductor region 11, the first p-type semiconductor region 20, the second p-type semiconductor region 30, and the p⁺-type semiconductor region 50. Here, the anode electrode 81 may be formed after forming an ohmic electrode 81a on the p⁺-type semiconductor region 50. The anode electrode 81 is made of e.g. Ni.

The cathode electrode 82 is formed in contact with the second surface 10b of the substrate 10. The cathode electrode 82 is made of e.g. Ti. Thus, the semiconductor device 110 is completed.

(Second Embodiment)

Next, a second embodiment is described.

Figure 7:
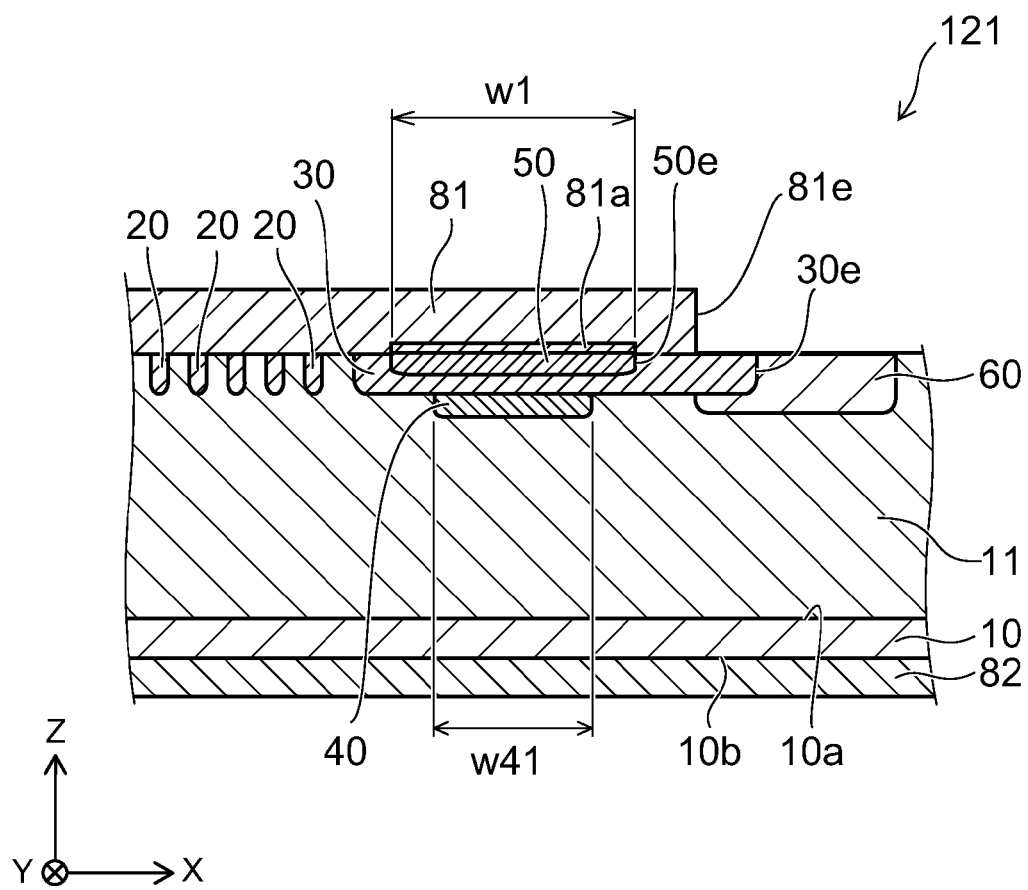
FIG. 7 is a schematic sectional view illustrating the configuration of a semiconductor device according to the second embodiment.

FIG. 7 is a schematic sectional view illustrating the configuration of a semiconductor device according to the second embodiment.

FIG. 7 shows the semiconductor device 121 according to the second embodiment.

In the semiconductor device 121 shown in FIG. 7, the size of the n⁻-type semiconductor region 40 is different from the size of the n⁻-type semiconductor region 40 of the semiconductor device 110 according to the first embodiment. The rest of the configuration is similar to that of the semiconductor device 110 according to the first embodiment.

(Third Embodiment)

Next, a third embodiment is described.

FIGS. 8A to 10 are schematic plan views illustrating the configuration of semiconductor devices according to the third embodiment.

Figure 8A:
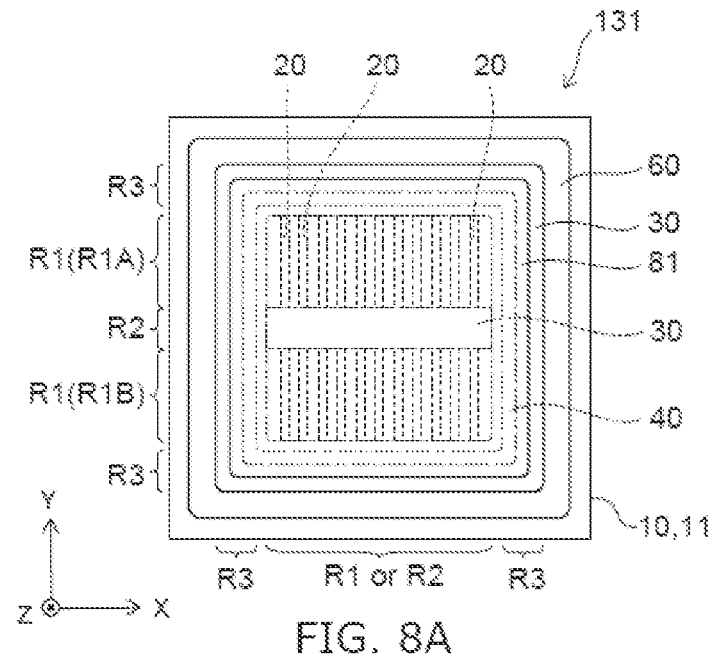
FIGS. 8A to 10 are schematic plan views illustrating the configuration of semiconductor devices according to the third embodiment.
Figure 8B:
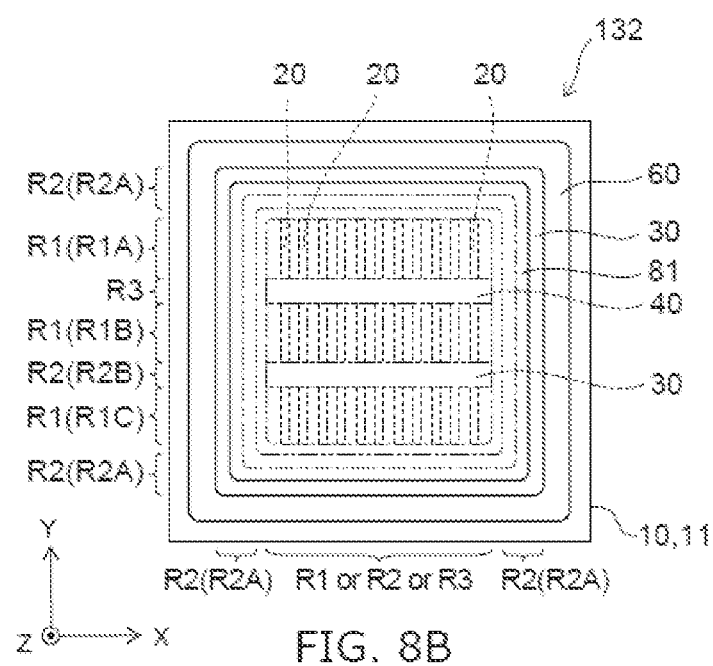
Figure 9A:
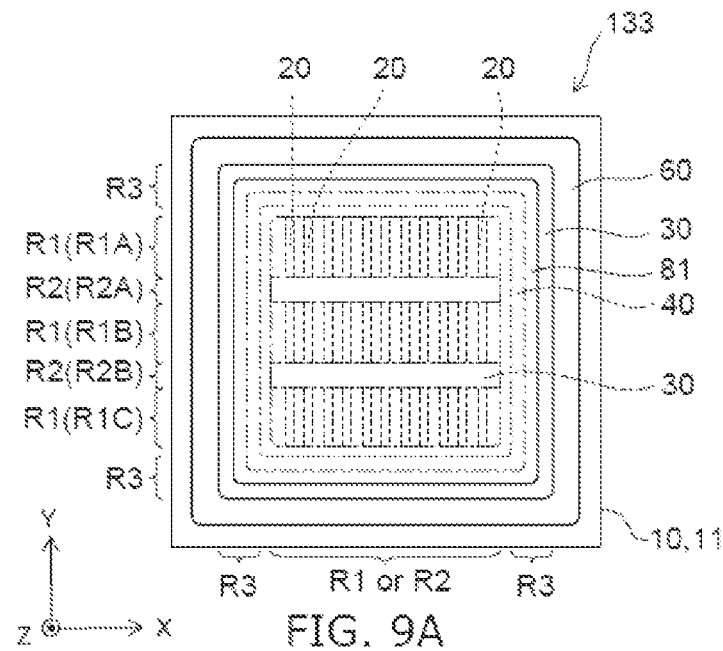
Figure 9B:
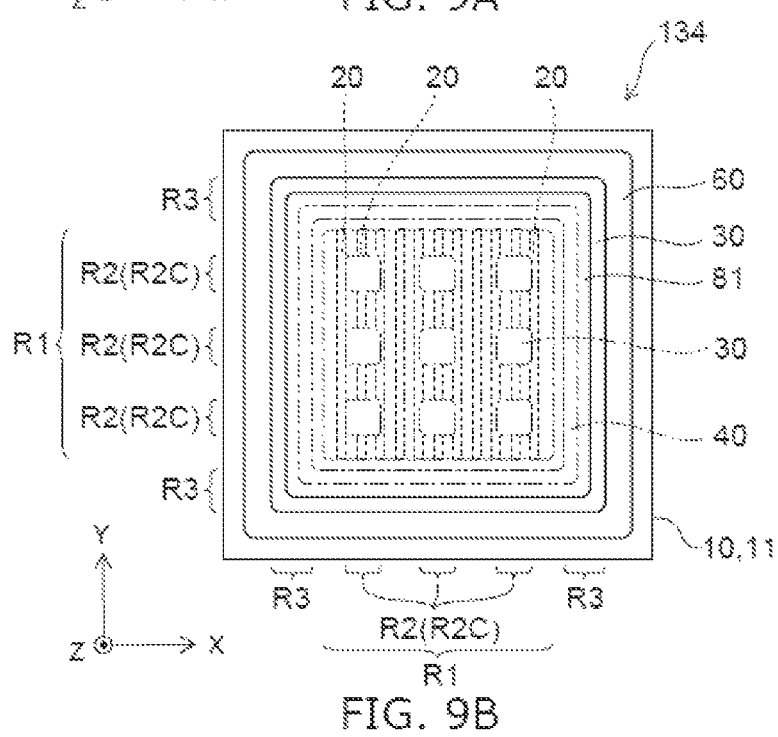
Figure 10:
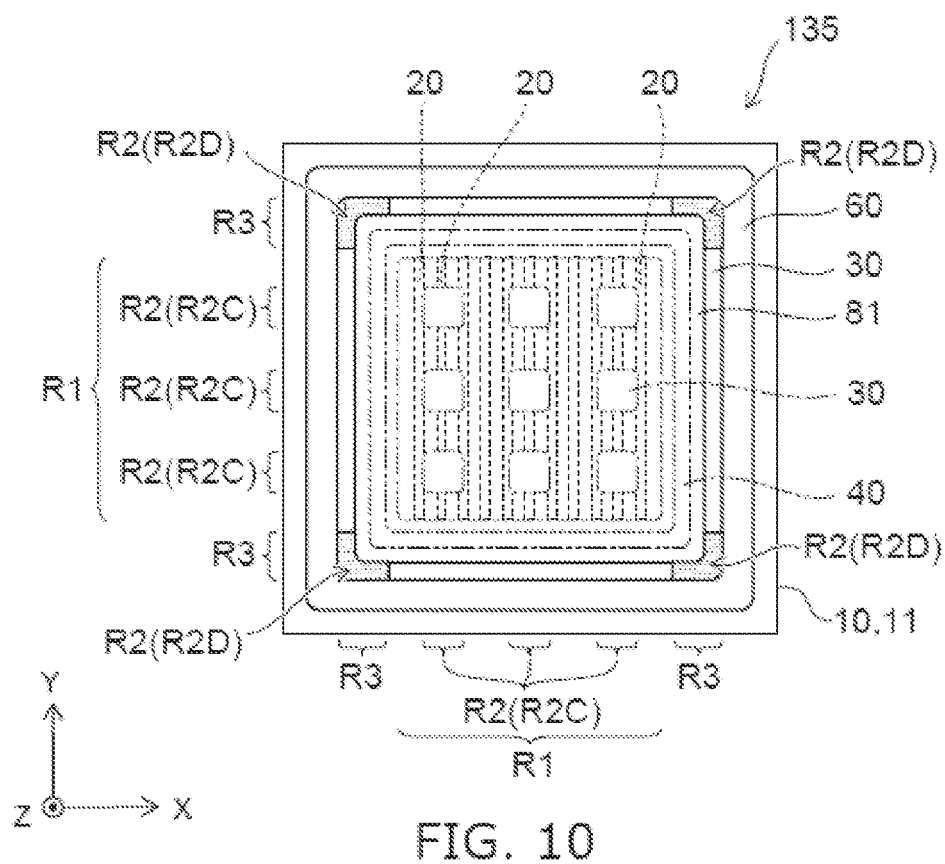

FIG. 8A shows a semiconductor device 131 according to a first example of the third embodiment. FIG. 8B shows a semiconductor device 132 according to a second example of the third embodiment. FIG. 9A shows a semiconductor device 133 according to a third example of the third embodiment. FIG. 9B shows a semiconductor device 134 according to a fourth example of the third embodiment. FIG. 10 shows a semiconductor device 135 according to a fifth example of the third embodiment.

As shown in FIG. 8A, the n⁻-type semiconductor region 11 of the semiconductor device 131 includes a first region R1, a second region R2, and a third region R3. In the semiconductor device 131, the first region R1 includes first region portions R1A and R1B. The first p-type semiconductor region 20 is provided between the first region R1 and the anode electrode 81. That is, a JBS diode is constituted on the first region R1.

The second p-type semiconductor region 30 is provided between the second region R2 and the anode electrode 81, and between the third region R3 and the anode electrode 81. The n⁻-type semiconductor region 40 is not provided between the second region R2 and the anode electrode 81. That is, a P-N diode not including the n⁻-type semiconductor region 40 is constituted on the second region R2.

The n⁻-type semiconductor region 40 is provided between the third region R3 and the anode electrode 81. That is, a P-N diode including the n⁻-type semiconductor region 40 is constituted on the third region R3.

In the semiconductor device 131, as viewed in the Z-direction, the third region R3 is provided so as to surround the first region R1. The first region R1 is provided on both sides of the second region R2. On one side of the second region R2, the first region portion R1A is provided. On the other side, the first region portion R1B is provided.

As shown in FIG. 8B, the n⁻-type semiconductor region 11 of the semiconductor device 132 includes a first region R1, a second region R2, and a third region R3. In the semiconductor device 132, the first region R1 includes first region portions R1A, R1B, and R1C. In the semiconductor device 132, the second region R2 includes second region portions R2A and R2B.

Like the semiconductor device 131, a JBS diode is constituted on the first region R1. A P-N diode not including the n⁻-type semiconductor region 40 is constituted on the second region R2. A P-N diode including the n⁻-type semiconductor region 40 is constituted on the third region R3.

In the semiconductor device 132, as viewed in the Z-direction, the second region portion R2A is provided so as to surround the first region R1. The third region R3 and the second region portion R2B each extend in e.g. the X-direction. The second region portion R2B is provided parallel to the third region R3 at a prescribed spacing. The third region R3 is provided between the first region portion R1A and the first region portion R1B. The second region portion R2B is provided between the first region portion R1B and the first region portion R1C.

In the semiconductor devices 131 and 132 as described above, in the case where a low voltage (e.g., less than 3 V) is applied, the SBD based on the JBS diode constituted on the first region R1 is operated. In the case where a high voltage (e.g., 3 V or more) is applied, the P-N diode based on the JBS diode constituted on the first region R1, and the P-N diodes constituted on the second region R2 and the third region R3 are operated. The operation of the SBD realizes low on-voltage. The operation of the P-N diode realizes lower on-resistance (larger current).

Here, by providing the n⁻-type semiconductor region 40 formed on the third region R3, breakdown is more likely to occur in the portion of the n⁻-type semiconductor region 40 when the reverse voltage is applied. As a result, device destruction in the termination region is suppressed. That is, the anti-surge voltage is increased.

On the other hand, in the n⁻-type semiconductor region 40 having a higher n-type impurity concentration than the n⁻-type semiconductor region 11, the lifetime of minority carriers is shorter. Thus, the forward current is made lower than in the case of not providing the n⁻-type semiconductor region 40. That is, the anti-surge current is decreased.

Thus, in the semiconductor devices 131 and 132, a P-N diode not including the n⁻-type semiconductor region 40 is provided on the second region R2, and a P-N diode including the n⁻-type semiconductor region 40 is provided on the third region R3. In the semiconductor devices 131 and 132, the anti-surge voltage is increased by providing the P-N diode including the n⁻-type semiconductor region 40, and the anti-surge current is increased by providing the P-N diode not including the n⁻-type semiconductor region 40. The compatibility between the anti-surge voltage and the anti-surge current is achieved by the size and layout of the P-N diode including the n⁻-type semiconductor region 40 and the P-N diode not including the n⁻-type semiconductor region 40.

As shown in FIG. 9A, the n⁻-type semiconductor region 11 of the semiconductor device 133 includes a first region R1, a second region R2, and a third region R3. In the semiconductor device 133, the first region R1 includes first region portions R1A, R1B, and R1C. In the semiconductor device 133, the second region R2 includes second region portions R2A and R2B.

In the semiconductor device 133, as viewed in the Z-direction, the third region R3 is provided so as to surround the first region R1. The second region portions R2A and R2B each extend in e.g. the X-direction. The second region portion R2A is provided parallel to the second region portion R2B at a prescribed spacing.

Like the semiconductor devices 131 and 132, a JBS diode is constituted on the first region R1. A P-N diode not including the n⁻-type semiconductor region 40 is constituted on the second region R2. A P-N diode including the n⁻-type semiconductor region 40 is constituted on the third region R3.

In the semiconductor device 133 as described above, the P-N diode including the n⁻-type semiconductor region 40 is provided on the third region R3. Thus, the electric intensity under reverse bias application is stronger than in the termination part. By providing the third region R3 near the termination part, breakdown stably occurs at a lower voltage than in the termination part even during operation in dynamic characteristics. This suppresses device destruction.

On the other hand, the P-N diode not including the n⁻-type semiconductor region 40 is provided on the second region R2. This prolongs the minority carrier lifetime and increases the forward current.

With the increase of the area of the second region R2, the forward current increases. On the other hand, with the increase of the area of the second region R2, the first region R1 for providing the JBS diode is made smaller, and hence the steady forward current decreases. Thus, the optimal area of the second region R2 depends on the standards of the steady forward current value and the forward surge current value. Typically, the optimal area of the second region R2 is preferably set to a value of approximately 5 percent (%) or more and 15% or less of the area of the first region R1.

Furthermore, by dispersing the second region R2 at a plurality of sites, heat generation at the time of flow of the forward surge current is dispersed throughout the chip. This suppresses thermal destruction by the surge current and improves the surge withstand capability.

As shown in FIG. 9B, the $n^-$-type semiconductor region 11 of the semiconductor device 134 includes a first region R1, a second region R2, and a third region R3. In the semiconductor device 134, the second region R2 includes a plurality of second region portions R2C. The plurality of second region portions R2C are arranged inside the first region R1. In the example shown in FIG. 9B, the plurality of second region portions R2C are arranged at a prescribed spacing in each of the X-direction and the Y-direction. As viewed in the Z-direction, the third region R3 is provided so as to surround the first region R1.

Like the semiconductor devices 131, 132, and 133, a JBS diode is constituted on the first region R1. A P-N diode not including the $n^-$-type semiconductor region 40 is constituted on the second region R2. A P-N diode including the $n^-$-type semiconductor region 40 is constituted on the third region R3.

In the semiconductor device 134 as described above, the size of the P-N diode provided on the plurality of second region portions R2C is approximately five times or more the thickness of the $n^-$-type semiconductor region 11. Thus, a plurality of second region portions R2C are provided on the entire surface of the chip, and P-N diodes are provided on the second region portions R2C. This further improves the forward surge withstand capability.

As shown in FIG. 10, the $n^-$-type semiconductor region 11 of the semiconductor device 135 includes a first region R1, a second region R2, and a third region R3. In the semiconductor device 135, the second region includes a plurality of second region portions R2C and a plurality of second region portions R2D. The rest of the configuration of the semiconductor device 135 is similar to that of the semiconductor device 134.

The plurality of second region portions R2D are provided at positions corresponding to the corners of the third region R3. In the example shown in FIG. 10, the second region portions R2D are respectively provided at positions corresponding to the four corners of the third region R3.

In the semiconductor device 135, at the time of breakdown due to application of reverse surge voltage, the current concentrates at the position corresponding to the corner of the third region R3. Thus, device destruction is likely to occur. However, in the semiconductor device 135, the second region portions R2D are provided at positions corresponding to the corners of the third region R3. This increases the breakdown voltage at these corners. Thus, at the time of reverse surge voltage application, no current flows at the corners. This suppresses device destruction at the corners.

As described above, the semiconductor device according to the embodiments can improve the withstand capability for surge voltage and the like.

For instance, in the description of the above embodiments and variations, the first conductivity type is n-type, and the second conductivity type is p-type. However, the invention is also practicable when the first conductivity type is p-type and the second conductivity type is n-type. Furthermore, in the above examples, each semiconductor region includes SiC. However, the invention is also applicable to semiconductors other than SiC (e.g., Si, GaN).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor region of a first conductivity type;
a first electrode forming a Schottky junction with the first semiconductor region;
a second semiconductor region of a second conductivity type provided between the first semiconductor region and the first electrode;
a third semiconductor region of the second conductivity type provided between the first semiconductor region and the first electrode, the third semiconductor region forming an ohmic junction with the first electrode;
a fourth semiconductor region of the first conductivity type provided between the first semiconductor region and the third semiconductor region, the fourth semiconductor region having a higher impurity concentration than the first semiconductor region;
a fifth semiconductor region of the second conductivity type provided between the third semiconductor region and the first electrode, the fifth semiconductor region having a higher impurity concentration than the third semiconductor region, wherein the fifth semiconductor region is surround by the third semiconductor region;
a second electrode provided on opposite side of the first semiconductor region from the first electrode.

2. The device according to claim 1, wherein a position of the fourth semiconductor region as viewed in a direction connecting the first semiconductor region and the first electrode is substantially equal to a position of the fifth semiconductor region as viewed in the direction.

3. The device according to claim 1, further comprising:
a sixth semiconductor region of the second conductivity type provided so as to surround an end of the third semiconductor region, the sixth semiconductor region having a lower impurity concentration than the third semiconductor region.

4. The device according to claim 1, wherein as viewed in a direction connecting the first semiconductor region and the first electrode, an outer peripheral edge of the first electrode is provided between an end of the fifth semiconductor region and an end of the third semiconductor region.

5. The device according to claim 1, wherein
as viewed in a direction connecting the first semiconductor region and the first electrode, the first semiconductor region includes a first region, a second region, and a third region,
the second semiconductor region is provided between the first region and the first electrode,
the third semiconductor region is provided between the second region and the first electrode and between the third region and the first electrode, and
the fourth semiconductor region is provided between the third region and the first electrode, and not provided between the second region and the first electrode.

6. The device according to claim 1, wherein the first semiconductor region, the second semiconductor region, the third semiconductor region, the fourth semiconductor region, and the fifth semiconductor region include SiC.

7. The device according to claim 1, wherein
the second semiconductor region is provided in a plurality, and
the plurality of second semiconductor regions are provided so as to extend in one direction, and provided parallel to each other.

8. The device according to claim 7, wherein the third semiconductor region is provided so as to surround the plurality of second semiconductor regions.

9. The device according to claim 7, wherein the fourth semiconductor region is provided so as to surround the plurality of second semiconductor regions.

10. The device according to claim 5, wherein
as viewed in the direction, the first region includes a first portion and a second portion, and
as viewed in the direction, the second region is provided between the first portion and the second portion.

11. The device according to claim 10, wherein the third region is provided so as to surround the first region.

12. The device according to claim 5, wherein
as viewed in the direction, the first region includes a first portion, a second portion, and a third portion,
as viewed in the direction, the second region is provided between the second portion and the third portion, and
as viewed in the direction, the third region is provided between the first portion and the second portion.

13. The device according to claim 5, wherein
as viewed in the direction, the first region includes a first portion, a second portion, and a third portion,
as viewed in the direction, the second region includes a fourth portion and a fifth portion,
as viewed in the direction, the third region is provided between the first portion and the second portion,
as viewed in the direction, the fifth portion is provided between the second portion and the third portion, and
as viewed in the direction, the fourth portion is provided so as to surround the first region.

14. The device according to claim 5, wherein
as viewed in the direction, the first region includes a first portion, a second portion, and a third portion,
as viewed in the direction, the second region includes a fourth portion and a fifth portion,
as viewed in the direction, the fourth portion is provided between the first portion and the second portion, and
as viewed in the direction, the fifth portion is provided between the second portion and the third portion.

15. The device according to claim 14, wherein as viewed in the direction, the third region is provided so as to surround the first region.

16. The device according to claim 5, wherein
the second region includes a plurality of fourth portions, and
the plurality of fourth portions are arranged inside the first region.

17. The device according to claim 16, wherein as viewed in the direction, the third region is provided so as to surround the first region.

18. The device according to claim 5, wherein
the second region includes a plurality of fourth portions,
the third region is provided so as to surround the first region, and
the plurality of fourth portions are provided at a position corresponding to a corner of the third region.

* * * * *